(12) United States Patent
Shiung et al.

(10) Patent No.: US 7,964,936 B2
(45) Date of Patent: Jun. 21, 2011

(54) ELECTRONIC DEVICE PACKAGE WITH ELECTROMAGNETIC COMPATIBILITY (EMC) COATING THEREON

(75) Inventors: Shin-Chang Shiung, Taichung (TW); Tzu-Han Lin, Hsinchu (TW); Chieh-Yuan Cheng, Hsinchu (TW); Li-Hsin Tseng, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 65 days.

(21) Appl. No.: 12/170,857

(22) Filed: Jul. 10, 2008

(65) Prior Publication Data

US 2010/0006965 A1    Jan. 14, 2010

(51) Int. Cl.
*H01L 23/552* (2006.01)

(52) U.S. Cl. ............ 257/659; 257/98; 257/99; 257/435; 257/437; 257/660; 257/E23.114; 257/E23.116; 438/25; 438/29

(58) Field of Classification Search .................. 257/659, 257/660, E23.114, E23.116, 98, 99, 432, 257/435, 437; 438/25, 29
See application file for complete search history.

(56) References Cited

U.S. PATENT DOCUMENTS

| | | | |
|---|---|---|---|
| 2003/0223008 A1 | 12/2003 | Kim et al. | |
| 2005/0024521 A1* | 2/2005 | Chen | 348/340 |
| 2006/0083948 A1* | 4/2006 | Kawaguchi et al. | 428/692.1 |
| 2008/0099900 A1* | 5/2008 | Oganesian et al. | 257/678 |
| 2008/0164550 A1* | 7/2008 | Chen et al. | 257/432 |
| 2008/0239519 A1* | 10/2008 | Lin | 359/819 |
| 2008/0284897 A1* | 11/2008 | Lv | 348/340 |

* cited by examiner

*Primary Examiner* — Benjamin P Sandvik
*Assistant Examiner* — Farid Khan
(74) *Attorney, Agent, or Firm* — Muncy, Geissler, Olds & Lowe, PLLC

(57) ABSTRACT

Electronic device packages with electromagnetic compatibility (EMC) coating thereon are presented. An electronic device package includes a chip scale package having a CMOS image sensor (CIS) array chip and a set of lenses configured with an aperture. An encapsulation is molded overlying the chip scale package. A shield is atop the encapsulation. A frame fixes the set of lenses to the encapsulation. An electromagnetic compatibility (EMC) coating is formed on the encapsulation to prevent electromagnetic interference.

26 Claims, 6 Drawing Sheets

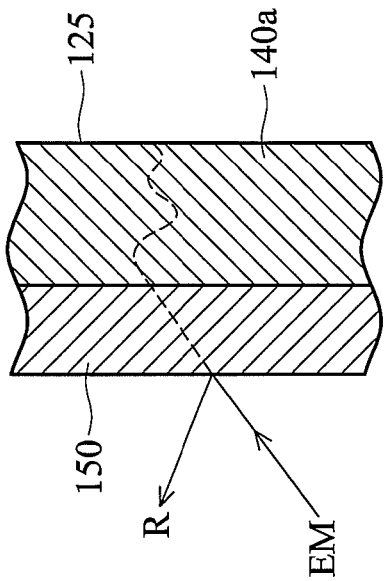
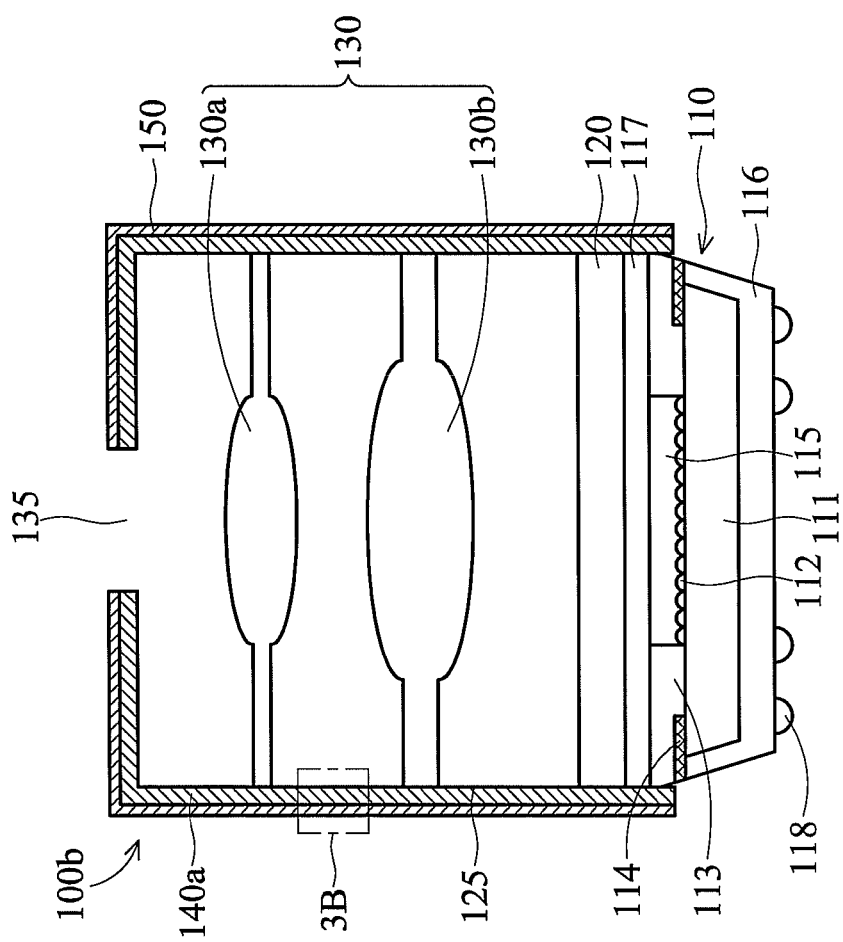

ELECTRONIC DEVICE PACKAGE WITH ELECTROMAGNETIC COMPATIBILITY (EMC) COATING THEREON

BACKGROUND OF THE INVENTION

1. Field of the Invention

The invention relates to electronic device packages, and more particularly to image sensor packages with electromagnetic compatibility (EMC) coating thereon.

2. Description of the Related Art

Anti-electromagnetic interference (EMI)/electromagnetic compatibility (EMC) are essential to digital cameras utilizing high-resolution electronic imaging sensors. Metal cases are conventionally used as EMC means to prevent electromagnetic interference from other components in the digital camera system. Although metal cases have some mechanical advantages, they occupy a lot of space. Moreover, reworking or reprocessing image sensor modules with metal cases when required, such as when misassembled, is difficult, thus resulting in higher production costs and lower yields.

U.S. Pub. No. 2003/0223008, the entirety of which is hereby incorporated by reference, discloses a camera module which consists of an image sensor module assembled with an image signal process package on a substrate. An EMC layer is encapsulated on the back side of the substrate.

FIG. 1 shows a schematic view of a conventional metal case assembled with an image sensor module. Referring to FIG. 1, an optoelectronic package 10 includes a metal case 9 assembled with an image sensor module. The image sensor module is composed of an image sensor chip scale package (CSP) 3, a cover glass 5 on the CSP 3, and a set of optical lenses 7 with an aperture 6. Note that making the metal case 9 conform to the image sensor module is difficult. Practically, the metal case assembly is soldered and mounted on a printed circuit board (not shown), wherein the printed circuit board is externally connected to the ground. Additional assemble procedures are needed, which increases production costs. The optoelectronic package 10 configured with the metal case can only be tested after a backend process of being grounded to the printed circuit board is completed. As a result, when errors are found during anti-EMI capability testing, reworking or reprocessing the image sensor modules is difficult. Therefore, an EMC shield capable of preventing package assembly errors as well as reducing inner EM scattering interference effects is desired.

BRIEF SUMMARY OF THE INVENTION

The invention is directed to image sensor packages with electromagnetic compatibility (EMC) shielding. The image sensor packages are further configured with an anti-EMI coating aperture to prevent inner EM scattering interference effects.

Embodiments of the invention provide an electronic device package with electromagnetic compatibility (EMC) coating thereon, comprising: a chip scale package having an image sensor array chip and a set of optical elements, an encapsulation encapsulating the chip scale package; and an electromagnetic compatibility (EMC) coating on the encapsulation to prevent electromagnetic interference.

Embodiments of the invention further provide an electronic device package with electromagnetic compatibility (EMC) coating thereon, comprising: a chip scale package having a CMOS image sensor (CIS) array chip and a set of lenses configured with an aperture; an encapsulation encapsulating the chip scale package; a shield atop the encapsulation; a frame fixing the set of lenses to the encapsulation; and an electromagnetic compatibility (EMC) coating on the encapsulation to prevent electromagnetic interference.

BRIEF DESCRIPTION OF DRAWINGS

The invention can be more fully understood by reading the subsequent detailed description and examples with references made to the accompanying drawings, wherein:

FIG. 3A is a cross section of a second embodiment of the electronic device package with electromagnetic compatibility (EMC) coating thereon;

FIG. 3B is an enlargement of an area 3B of the hybrid absorption layer 140 and 150 in FIG. 3A;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
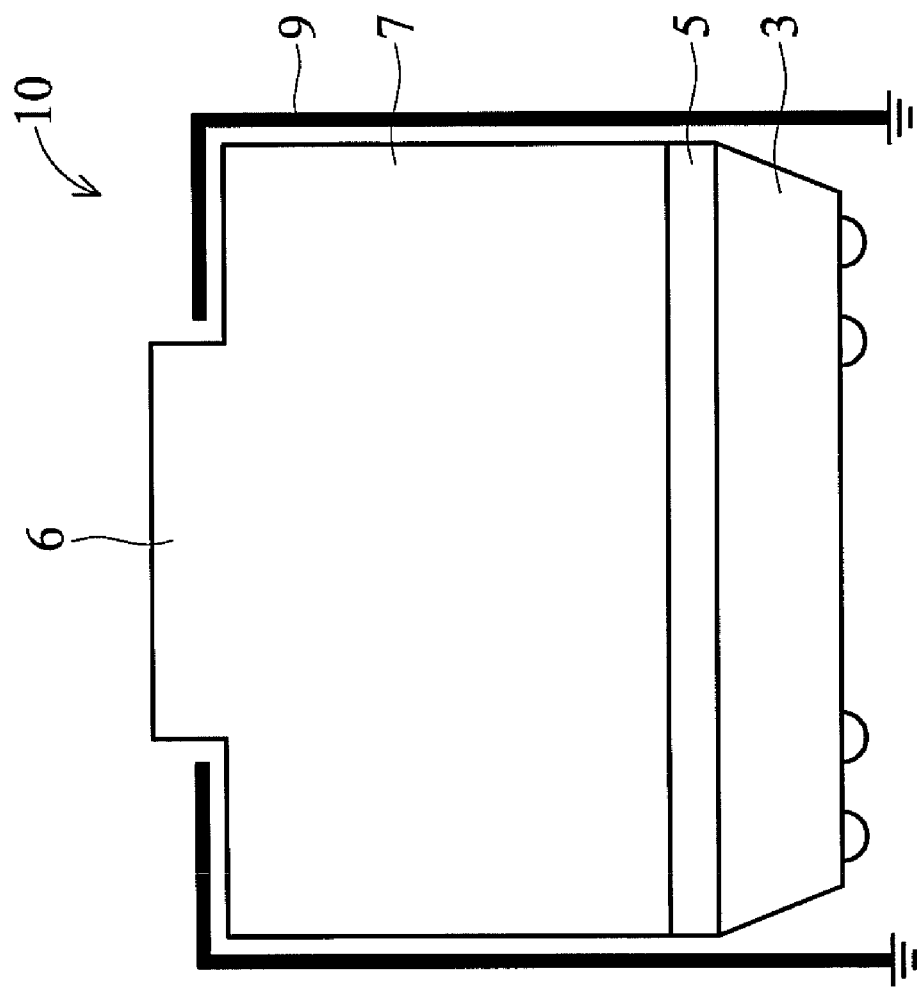
FIG. 1 shows a schematic view of a conventional metal case assembled with an image sensor module.
Figure 2A:
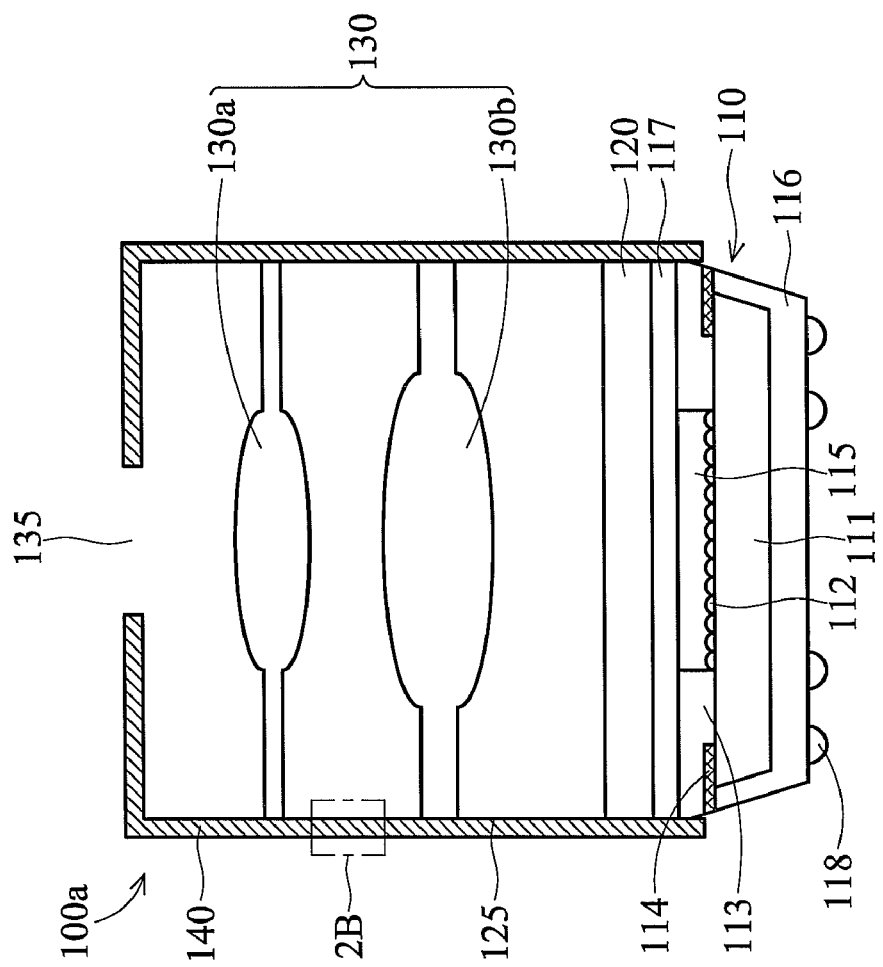
FIG. 2A is a cross section of a first embodiment of the electronic device package with electromagnetic compatibility (EMC) coating thereon.
Figure 2B:
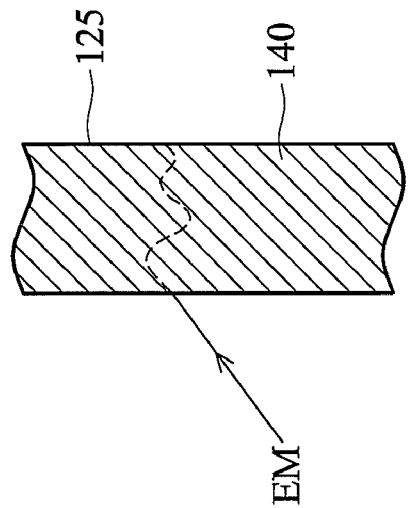
FIG. 2B is an enlargement of an area 2B of the absorption layer 140 in FIG. 2A.

FIG. 2A is a cross section of a first embodiment of the electronic device package with electromagnetic compatibility (EMC) coating thereon. FIG. 2B is an enlargement of an area 2B of the absorption layer 140 in FIG. 2A. Referring to FIG. 2A, an electronic device package 100a comprises a chip scale package having an image sensor array chip 110 and a set of optical elements 130. An encapsulation 125 is molded overlying the chip scale package. A cover glass 120 is disposed between the image sensor array chip 110 and the set of optical elements 130. An electromagnetic compatibility (EMC) coating 140 is disposed on the encapsulation to prevent electromagnetic interference.

The chip scale package 100 can be a CMOS image sensor chip scale package. A transparent substrate 117 is configured as a support structure for the package. A CMOS image sensor chip 111 with a sensor array surface 112 and electrode pads 114 is attached on the transparent substrate 117. A dam structure 113 is interposed between the image sensor chip 111 and the transparent substrate 117 creating a gap 115 on the sensor array surface 112. A protection layer 116 is formed on the CMOS image sensor chip 111. Electrical connection traces (not shown) extend from the electrode pads 114 to a plurality of ball grids 118 on the back of the protection layer 116.

According to an embodiment of the invention, the electromagnetic compatibility (EMC) coating 140 is disposed on an outer surface of the encapsulation 125. The electromagnetic compatibility (EMC) coating 140 can be an electromagnetic absorption layer, comprising ferromagnetic material, ferrite magnetic material and anti-ferrite magnetic material. The electromagnetic compatibility (EMC) coating 140 should be non-conductive. The electromagnetic compatibility (EMC) coating 140 can be formed by spraying, spin coating, dipping, tapping, or sputtering. An electromagnetic EM wave generated from an ambient environment can be absorbed and attenuated by the electromagnetic compatibility (EMC) coating 140, as shown in FIG. 2B.

Moreover, the set of optical elements 130 comprises a set of lenses 130a and 130b. The image sensor array chip 111 can include an inner circuit connected to the ground.

FIG. 3A is a cross section of a second embodiment of the electronic device package with electromagnetic compatibility (EMC) coating thereon. FIG. 3B is an enlargement of an area 3B of the hybrid absorption layer 140 and 150 in FIG. 3A. Referring to FIG. 3A, an electronic device package 100b comprises a chip scale package having an image sensor array chip 110 and a set of optical elements 130. An encapsulation 125 is molded overlying the chip scale package. A cover glass 120 is disposed between the image sensor array chip 110 and the set of optical elements 130. A hybrid electromagnetic compatibility (EMC) coating including an electromagnetic absorption layer 140a and a partial electromagnetic reflection layer 150 is disposed on the encapsulation to prevent electromagnetic interference.

According to an embodiment of the invention, the electromagnetic absorption layer 140a is disposed on an outer surface of the encapsulation 125. The electromagnetic absorption layer 140a can be an electromagnetic absorption layer, comprising ferromagnetic material, ferrite magnetic material and anti-ferrite magnetic material. The electromagnetic absorption layer 140a should be non-conductive. The partial electromagnetic reflection layer 150 can be conductive and metallic comprising Ag, Cu, Ni and combinations thereof. The partial electromagnetic reflection layer 150 can partially reflect EM for a certain spectrum band and partially transmit for another spectrum band. Both of the electromagnetic absorption layer 140a and the partial electromagnetic reflection layer 150 can be formed by spraying, spin coating, dipping, tapping, or sputtering. An electromagnetic EM wave generated from an ambient environment can be partially reflected R and transmitted by the partial electromagnetic reflection layer 150, then further absorbed and attenuated by the electromagnetic absorption layer 140a, as shown in FIG. 3B.

Figure 4:
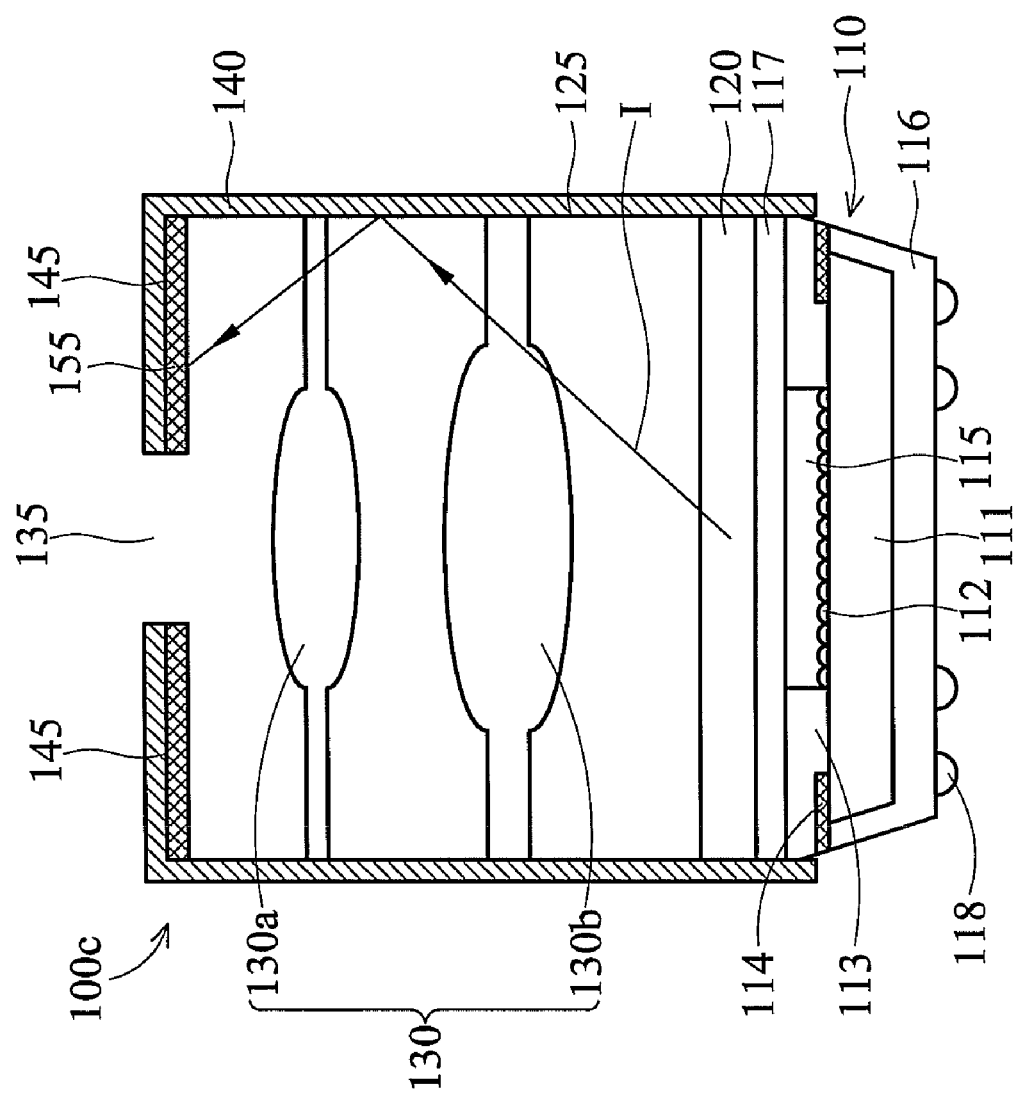
FIG. 4 is a cross section of a third embodiment of the electronic device package with electromagnetic compatibility (EMC) coating thereon.

FIG. 4 is a cross section of a third embodiment of the electronic device package with electromagnetic compatibility (EMC) coating thereon. The electronic device package 100c is nearly identical to the electronic device package 100a of the first embodiment and for simplicity its detailed description is omitted. The electronic device package 100c of the third embodiment is different from the first embodiment in that the set of optical elements 130 comprises a set of lenses 130a and 130b configured with an aperture 135. A shield 145 is atop the encapsulation, wherein a partial electromagnetic reflection layer 155 is disposed on an inner surface of the shield 145 to absorb reflection I inside the electronic device package 100c.

Figure 5:
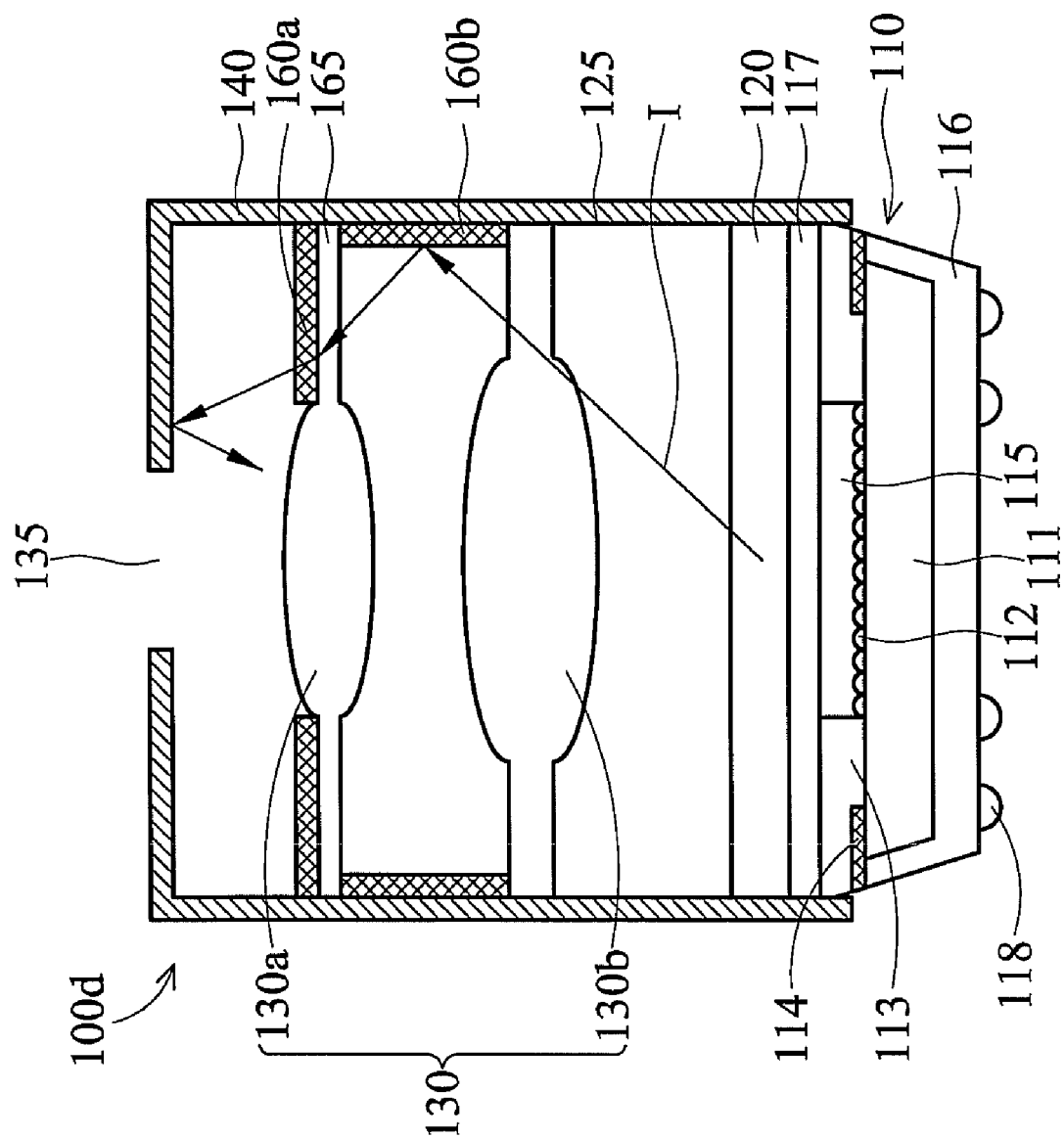
FIG. 5 is a cross section of a fourth embodiment of the electronic device package with electromagnetic compatibility (EMC) coating thereon.

FIG. 5 is a cross section of a fourth embodiment of the electronic device package with electromagnetic compatibility (EMC) coating thereon. The electronic device package 100d is nearly identical to the electronic device package 100a of the first embodiment and for simplicity its detailed description is omitted. The electronic device package 100d of the fourth embodiment is different from the first embodiment in that a frame 165 fixed to the encapsulation 125, wherein the partial electromagnetic reflection layer 160a is disposed on the frame 165. A partial electromagnetic reflection layer 160b can be disposed on an inner surface of the encapsulation 125. Scattering of EM waves inside of the electronic device package 100d can be absorbed and prevented.

Figure 6:
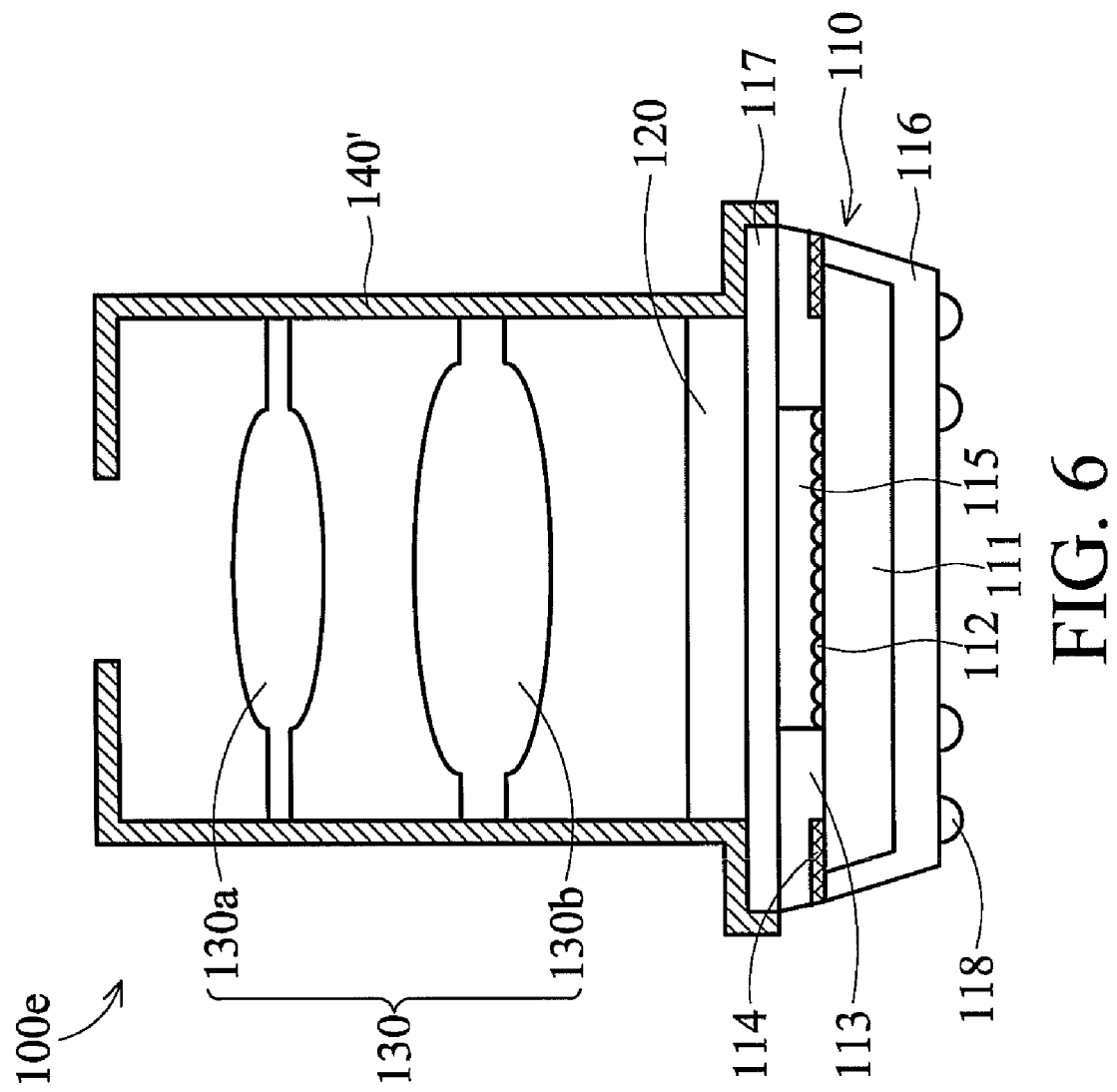
FIG. 6 is a cross section of a fifth embodiment of the electronic device package with electromagnetic compatibility (EMC) coating thereon.

FIG. 6 is a cross section of a fifth embodiment of the electronic device package with electromagnetic compatibility (EMC) coating thereon. The electronic device package 100e is nearly identical to the electronic device package 100a of the first embodiment and for simplicity its detailed description is omitted. The electronic device package 100e of the fifth embodiment is different from the first embodiment in that the area of the set of optical elements 130 is less than or equal to the area of the image sensor array chip 110. The electromagnetic compatibility (EMC) coating 140' is conformally disposed on the set of optical elements 130 and the image sensor array chip 110.

While the abovementioned embodiments of the invention have been described in conjunction with an example of a CMOS image sensor device package, the features of the embodiments may also be applied to optoelectronic device packages.

The abovementioned embodiments of the invention is advantageous in that a non-conductive electromagnetic compatibility (EMC) coating is formed on the electronic device package so that electromagnetic EM waves generated from an ambient environment can be absorbed and attenuated by the electromagnetic compatibility (EMC) coating. A partial electromagnetic reflection layer 150 can be formed on a top shield layer, on a lens frame, and/or on an inner surface of the encapsulation, thereby prevention scattering inside of the electronic device package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device package with electromagnetic compatibility (EMC) coating thereon, comprising:
    a chip scale package integrating an image sensor array chip and a set of optical elements in a single encapsulation; and
    an electromagnetic compatibility (EMC) coating on the single encapsulation to prevent electromagnetic interference; and
    a partial electromagnetic reflection layer disposed on an inner surface of the single encapsulation, wherein the partial electromagnetic reflection layer is disposed above one of the optical elements.

2. The electronic device package according to claim 1, wherein the electromagnetic compatibility (EMC) coating is disposed on an outer surface of the single encapsulation.

3. The electronic device package according to claim 1, wherein the electromagnetic compatibility (EMC) coating comprises an electromagnetic absorption layer.

4. The electronic device package according to claim 3, wherein the electromagnetic absorption layer includes ferromagnetic material, ferrite magnetic material and anti-ferrite magnetic material.

5. The electronic device package according to claim 1, wherein the electromagnetic compatibility (EMC) coating is a hybrid layer comprising an electromagnetic absorption layer and a partial electromagnetic reflection layer.

6. The electronic device package according to claim 5, wherein the partial electromagnetic reflection layer is conductive metals comprising Ag, Cu, Ni and combinations thereof.

7. The electronic device package according to claim 1, wherein the set of optical elements comprises a set of lenses configured with an aperture.

8. The electronic device package according to claim 7, further comprising a shield atop the single encapsulation, wherein the partial electromagnetic reflection layer is disposed on an inner surface of the shield.

9. The electronic device package according to claim 1, further comprising a frame fixed to the single encapsulation, wherein the partial electromagnetic reflection layer is disposed on the frame.

10. The electronic device package according to claim 1, wherein the image sensor array chip includes a grounded inner circuit.

11. The electronic device package according to claim 7, wherein the area of the set of optical elements is less than or equal to the area of the image sensor array chip.

12. The electronic device package according to claim 11, wherein the electromagnetic compatibility (EMC) coating is conformably disposed on the set of optical elements and the image sensor array chip.

13. The electronic device package according to claim 1, wherein the electromagnetic compatibility (EMC) coating is formed by spraying, spin coating, dipping, tapping, or sputtering.

14. An electronic device package with electromagnetic compatibility (EMC) coating thereon, comprising:
   a chip scale package integrating a CMOS image sensor (CIS) array chip and a set of lenses configured with an aperture in a single straight barrel encapsulation;
   a shield atop the single straight barrel encapsulation;
   a frame fixing the set of lenses to the single straight barrel encapsulation; and
   an electromagnetic compatibility (EMC) coating on the single straight barrel encapsulation to prevent electromagnetic interference; and
   a partial electromagnetic reflection layer disposed on an inner surface of the single encapsulation, wherein the partial electromagnetic reflection layer is disposed above one of the optical elements.

15. The electronic device package according to claim 14, wherein the electromagnetic compatibility (EMC) coating is disposed on an outer surface of the single straight barrel encapsulation.

16. The electronic device package according to claim 14, wherein the electromagnetic compatibility (EMC) coating comprises an electromagnetic absorption layer.

17. The electronic device package according to claim 16, wherein the electromagnetic absorption layer includes ferromagnetic material, ferrite magnetic material and anti-ferrite magnetic material.

18. The electronic device package according to claim 14, wherein the electromagnetic compatibility (EMC) coating is a hybrid layer comprising an electromagnetic absorption layer and a partial electromagnetic reflection layer.

19. The electronic device package according to claim 18, wherein the partial electromagnetic reflection layer is conductive metals comprising Ag, Cu, Ni and combinations thereof.

20. The electronic device package according to claim 14, wherein the set of optical elements comprises a set of lenses configured with an aperture.

21. The electronic device package according to claim 20, wherein the partial electromagnetic reflection layer is disposed on an inner surface of the shield.

22. The electronic device package according to claim 14, wherein the partial electromagnetic reflection layer is disposed on the frame.

23. The electronic device package according to claim 14, wherein the image sensor array chip includes a grounded inner circuit.

24. The electronic device package according to claim 20, wherein the electromagnetic compatibility (EMC) coating is conformably disposed on the set of optical elements and the image sensor array chip.

25. The electronic device package according to claim 24, wherein the electromagnetic compatibility (EMC) coating is conformably disposed on the set of optical elements and the image sensor array chip.

26. The electronic device package according to claim 14, wherein the electromagnetic compatibility (EMC) coating is formed by spraying, spin coating, dipping, tapping, or sputtering.

* * * * *